United States Patent
Wen

(10) Patent No.: US 9,859,134 B2
(45) Date of Patent: Jan. 2, 2018

(54) MULTI-CHAMBER SEMICONDUCTOR PROCESSING DEVICE

(75) Inventor: Sophia Wen, Wuxi (CN)

(73) Assignee: WUXI HUAYING MICROELECTRONICS TECHNOLOGY CO., LTD, Wuxi (CN)

( * ) Notice: Subject to any disclaimer, the term of this patent is extended or adjusted under 35 U.S.C. 154(b) by 779 days.

(21) Appl. No.: 14/234,215

(22) PCT Filed: Dec. 31, 2011

(86) PCT No.: PCT/CN2011/085095
§ 371 (c)(1),
(2), (4) Date: Jan. 22, 2014

(87) PCT Pub. No.: WO2013/016942
PCT Pub. Date: Feb. 7, 2013

(65) Prior Publication Data
US 2014/0158299 A1 Jun. 12, 2014

(30) Foreign Application Priority Data

Jul. 29, 2011 (CN) .......................... 2011 1 0217259

(51) Int. Cl.
*H01L 21/67* (2006.01)
(52) U.S. Cl.
CPC .... *H01L 21/67017* (2013.01); *H01L 21/6719* (2013.01); *H01L 21/67063* (2013.01); *H01L 21/67178* (2013.01)

(58) Field of Classification Search
CPC ......... H01L 21/67178; H01L 21/67063; H01L 21/67017; H01L 21/6719
See application file for complete search history.

(56) References Cited

FOREIGN PATENT DOCUMENTS

| JP | 03292731 A | * | 12/1991 |
| JP | 11016979 A | * | 1/1999 |
| JP | 2002359232 A | * | 12/2002 |
| JP | 2009032901 A | * | 2/2009 |

* cited by examiner

*Primary Examiner* — Yuechuan Yu
(74) *Attorney, Agent, or Firm* — Han IP Corporation

(57) ABSTRACT

The present disclosure provides a multi-chamber semiconductor processing apparatus including at least two micro chambers for receiving and processing a semiconductor wafer. Each micro chamber includes an upper chamber portion defining an upper working surface and a lower chamber portion defining a lower working surface. The upper chamber portion and the lower chamber portion are relatively movable between an open position for loading or removing the semiconductor wafer and a closed position for receiving and processing the semiconductor wafer. Compared with the prior art, the multi-chamber semiconductor processing apparatus of the present disclosure are provided with a plurality of micro chambers in a longitudinal direction, which enables the multi-chamber semiconductor processing apparatus to carry out single-wafer chemical processing on a plurality of semiconductor wafers at the same time.

10 Claims, 10 Drawing Sheets

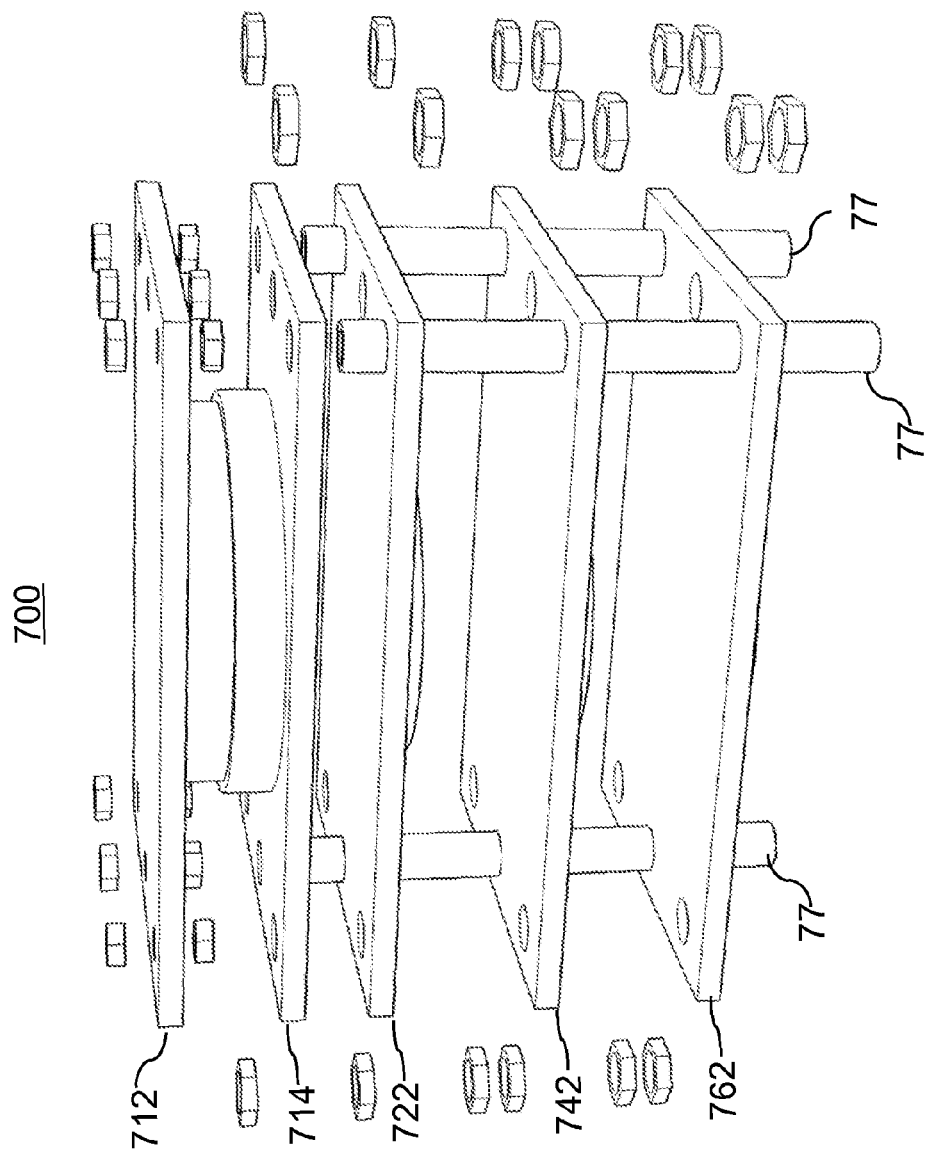

MULTI-CHAMBER SEMICONDUCTOR PROCESSING DEVICE

CROSS REFERENCE TO RELATED APPLICATIONS

This application is the U.S. national phase application of International application number PCT/CN2011/085095 filed on 31 Dec. 2011, which claims the priority benefit of China Patent Application No. 201110217259.8, filed on 29 Jul. 2011, which is hereby incorporated by reference in its entirety.

TECHNICAL FIELD

The present disclosure relates to the field of surface processing on semiconductor wafers or similar work pieces, and in particular to a multi-chamber semiconductor processing apparatus for chemically processing a surface of a semiconductor wafer, as well as for cleaning, etching and other processing.

BACKGROUND

During the process flow of manufacturing a semiconductor integrated circuit, nearly more than one hundred steps are related to wafer surface cleaning and chemical processing, and these steps account for 25%-35% of the total production process steps. Among the wafer surface chemical processing and cleaning equipment used in the present integrated circuit manufacturing industry, nearly 70% of them are still traditional batch-type processing cleaning equipment and RCA-type cleaning methods.

With the continuous increase of wafer size (200 mm→300 mm→450 mm) in integrated circuit production and the continuous decrease of electronic component line width (65 nm→45 nm→32 nm), those traditional batch-type chemical processing and cleaning technologies (i.e. more than 25 wafers are processed every time) have faced increasing challenges, including problems of wafer surface processing uniformity and problems of cross contamination that possibly occurs in batch-type processing; the problem of inadequate removal capability for ultra-micro particles; the problem of ultrastructure damage from Megasonic technology, the problem of high difficulty in chemical processing and cleaning of the surface of new materials with low and high dielectric constants and the surface of metal grid electrodes, and so on. Meanwhile, due to these numerous factors such as actual needs in single-side wafer chemical processing and cleaning, wafer thinning, connection of online equipment, etc., a gradual transformation from traditional batch-type processing to single wafer processing is promoted in the aspect of semiconductor wafer cleaning technology.

In actual use, the advantages of the single wafer processing technology have been clearly reflected in wide application of the back end of line (BEOL) of IC, and have begun gradually expanding to the front end of line (FEOL) of IC. However, wide application of the single wafer processing technology in the FEOL of IC has been seriously restricted by the low throughput problem of the single wafer chemical processing equipment relative to the traditional multi-wafer batch-type processing equipment. The throughput gap between the single wafer chemical processing equipment and the traditional batch-type processing equipment cannot be properly bridged only by adding more single wafer chemical processing equipment, this is because rise in cost of the solution for addressing this problem is much faster than throughput improvement.

Therefore, there is a need to provide a better solution for settling the above problems.

SUMMARY

An object of the present disclosure is to provide a multi-chamber semiconductor processing apparatus comprising a plurality of micro chambers longitudinally distributed on columns and each micro chamber can be employed to carry out single-wafer chemical processing on a plurality of semiconductor wafers at the same time.

In accordance with the object of the present disclosure, the present disclosure provides a multi-chamber semiconductor processing apparatus, at least two micro chambers for receiving and processing a semiconductor wafer, each micro chamber comprising an upper chamber portion defining an upper working surface and a lower chamber portion defining a lower working surface, the upper chamber portion and the lower chamber portion being relatively movable between an open position for loading or removing the semiconductor wafer and a closed position for receiving and processing the semiconductor wafer. In the closed position, the semiconductor wafer is disposed between the upper working surface and the lower working surface to define, between the semiconductor wafer and the inner wall of the micro chamber, gaps for processing fluids to flow. The micro chamber comprises at least one inlet for the processing fluids to enter into the micro chamber and at least one outlet for discharging the processing fluids out of the micro chamber Further, the multi-chamber semiconductor processing apparatus further comprises a drive device, and the upper chamber portion or the lower chamber portion of at least one micro chamber is driven by the drive device to move; and the other one of the upper chamber portion and the lower chamber portion is fixed on a predetermined position.

Further, the multi-chamber semiconductor processing apparatus further comprises a plurality of columns running through the upper chamber portion and the lower chamber portion of each micro chamber; and wherein the upper chamber portion and the lower chamber portion are relatively movable along the columns between the open position and the closed position.

The multi-chamber semiconductor processing apparatus further comprises a drive device located below the lower chamber portion of a bottommost micro chamber or/and a drive device located above the upper chamber portion of a topmost micro chamber; and wherein the drive device drives the corresponding chamber portion in a longitudinal direction, a retractable micro drive component is further disposed between the upper chamber portion and the lower chamber portion of each micro chamber, and the upper chamber portion and the lower chamber portion of each micro chamber move up or down under a guidance of the columns by a driving force from the micro drive component and the drive devices.

Further, the micro drive components is a helical extension springs sleeved to the columns, and a spring coefficient of the helical extension spring between the upper chamber portion and the lower chamber portion of the micro chamber located below is larger than that of the helical extension spring between the upper chamber portion and the lower chamber portion of the micro chamber located above.

Further, in two neighboring micro chambers, the lower chamber portion of the micro chamber located above in the longitudinal direction and the upper chamber portion of the micro chamber located below in the longitudinal direction are mutually fixed or integrally molded.

Further, the multi-chamber semiconductor processing apparatus comprises a drive device located below the lower chamber portion of a bottommost micro chamber or a drive device located above the upper chamber portion of a topmost micro chamber. The upper chamber portions of all the micro chambers are fixedly connected and the lower chamber portions of all the micro chambers are fixedly connected. When the drive device drives the lower chamber portion of the bottommost micro chamber to move up, the lower chamber portions of all the micro chambers move up; and when the drive device drives the upper chamber portion of the topmost micro chamber to move down, the upper chamber portions of all the micro chambers move down under a guidance of the columns.

Further, the upper chamber portions of all the micro chambers are fixed on a plurality of first sleeves, the lower chamber portions of all the micro chambers are fixed on a plurality of second sleeves; and wherein each of the first sleeves and each of the second sleeves are separately sleeved to the columns and are capable of moving up or down along the columns.

Further, screw threads are defined on outer surfaces of the first sleeves and the second sleeves, and the first sleeves and the second sleeves run through an edge of the upper chamber portion or the lower chamber portion and then are selectively fixed via nuts corresponding to the screw threads.

Further, the drive device includes a top cover plate and a bottom cover plate, the top cover plate and the bottom cover plate comprise substrates with corresponding shapes respectively, the substrate of the top cover plate extends downwardly to form a top side wall and the substrate of the bottom cover plate extends upwardly to form a bottom side wall, a cavity formed by the substrate of the top cover plate, the top side wall, the substrate of the bottom cover plate and the bottom side wall in an enclosure manner holds a fluid drive device connected with the substrates. One of the top cover plate or the bottom cover plate is fixed on the predetermined position of the columns, the other one of the top cover plate or the bottom cover plate and the chamber portion of the neighboring micro chamber are fixedly connected or integrally molded; and by means of expansion and contraction of the fluid drive device, the other one of the top cover plate and the bottom cover plate that is not fixed on the columns, and the neighboring chamber portion thereof are driven to move along the columns.

Further, the multi-chamber semiconductor processing apparatus further comprises a processing fluid supply device and a processing fluid collection device. The processing fluid supply device is connected with the inlet for the processing fluids to enter into the micro chamber, and is used for supplying the processing fluids. The processing fluid collection device is connected with the outlet for discharging the processing fluids out of the micro chamber, and is used for collecting waste fluids after processing of the semiconductor wafer by the processing fluids. The processing fluids include chemical agents and gases.

Compared with the prior art, the multi-chamber semiconductor processing apparatus of the disclosure employs a column guidance structure and is longitudinally provided with a plurality of micro chambers on columns. This enables the semiconductor processing apparatus to carry out single-wafer chemical processing on a plurality of semiconductor wafers at the same time.

BRIEF DESCRIPTION OF THE DRAWINGS

The present disclosure will be more readily understood by reference to the accompanying drawings and the detailed description hereinafter, in which like reference symbols correspond to like structural parts, wherein:

FIG. 7B is an exploded view of the upper chamber kit and the second upper drive device according to still another embodiment of the present disclosure;

DETAILED DESCRIPTION OF THE PREFERRED EMBODIMENTS

For better clarity and understanding of the object, features and advantages of the present disclosure, detailed description is further made below to the present disclosure in conjunction with the accompanying drawings and the embodiments.

For ease of illustrating the present disclosure, a micro chamber serving as one key component of a multi-chamber semiconductor processing apparatus provided in the present disclosure will be firstly illustrated. The micro chamber is used for receiving and processing a semiconductor wafer.

Figure 1:
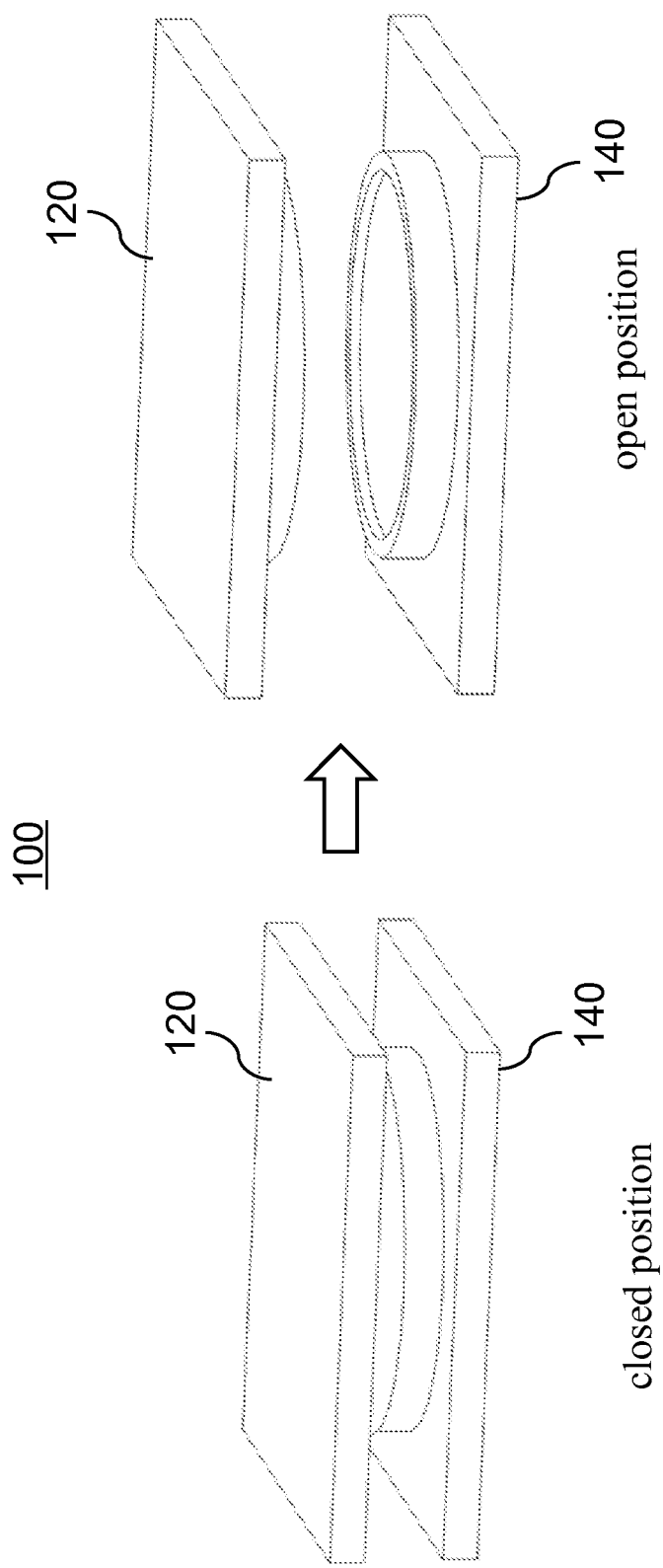
FIG. 1 is a perspective view of a micro chamber according to one embodiment of the present disclosure.

Referring to FIG. 1, it shows a perspective view of the micro chamber according to one embodiment 100 of the present disclosure. The micro chamber 100 includes an upper chamber portion 120 and a lower chamber portion 140. The upper chamber portion 120 includes a rectangular substrate, and an upper working surface and an upper perimeter portion formed by extending downwardly from the rectangular substrate. The lower chamber portion 140 also includes a rectangular substrate, and a lower working surface and a lower perimeter portion formed by extending upwardly from the rectangular substrate. The upper working surface, the upper perimeter portion, the lower working surface and the lower perimeter portion define, in an enclosure manner, a cavity for receiving and processing the semiconductor wafer. The upper chamber portion 120 and the lower chamber portion 140 can vary between a closed position and an open position under the guidance of columns (not shown). In the open position, the upper chamber portion 120 and the lower chamber portion 140 are separated from each other to load and remove the semiconductor wafer, which is to be processed or has been processed, into or out of the micro chamber. In the closed position, the upper chamber portion 120 and the lower chamber portion 140 are correspondingly and tightly adhered to each other, and the upper working surface, the upper perimeter portion, the lower working surface and the lower perimeter portion define, in an enclosure manner, the cavity for receiving the semiconductor wafer. When the semiconductor wafer is loaded into the micro chamber and the micro chamber is in the closed position, chemical agents and other fluids can be introduced into the micro chamber for analysis, cleaning, etching and other processing on the semiconductor wafer therein, and during and after the processing, the used chemical agents and other fluids are introduced out of the micro chamber.

A drive device that serves as another key component of the multi-chamber semiconductor processing apparatus will be illustrated below. The drive device is disposed above the upper chamber portion or below the lower chamber portion, and is used for driving the upper chamber portion or the lower chamber portion to move up and down under the guidance of the columns.

Figure 2:
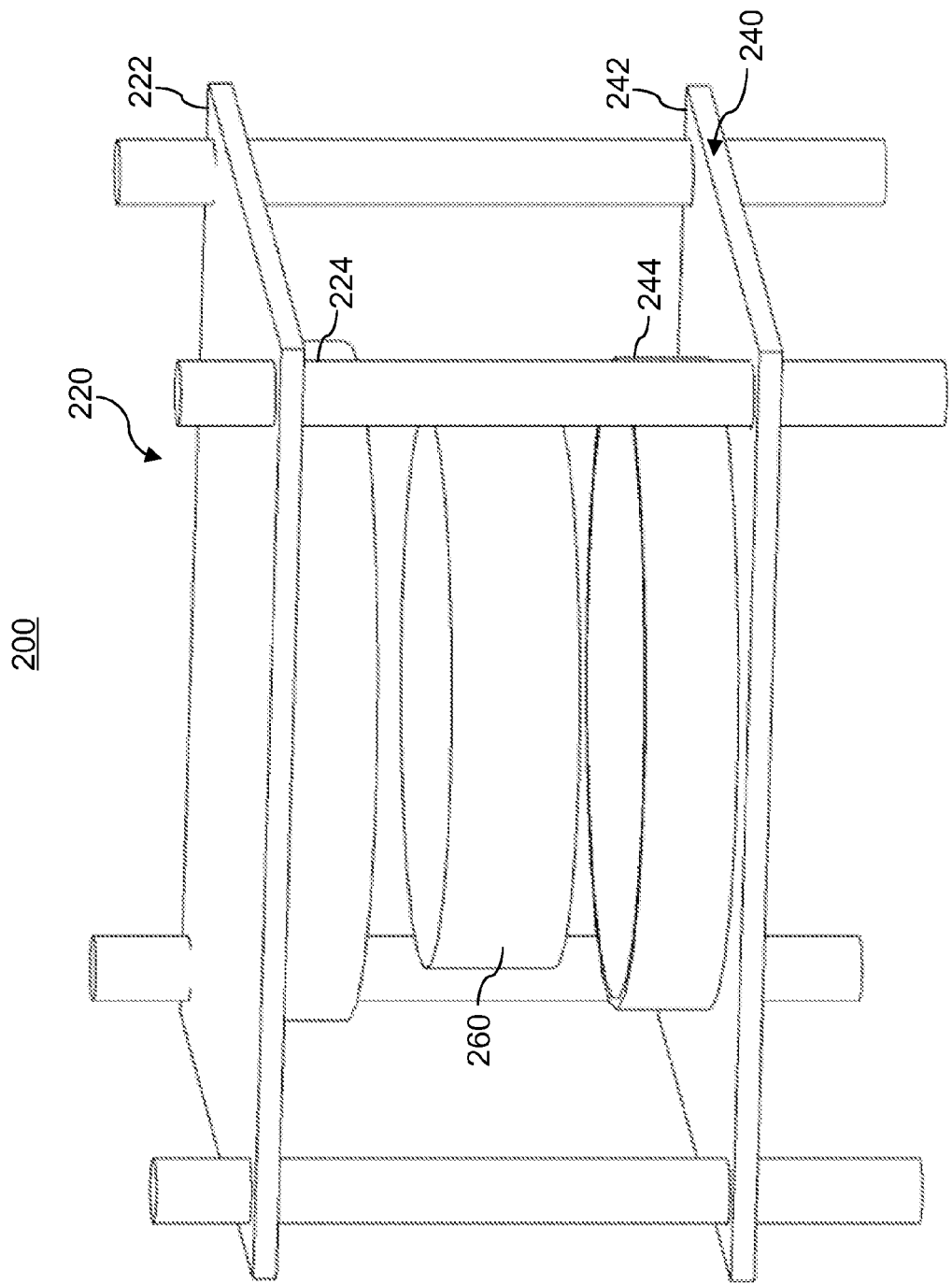
FIG. 2 is a perspective view of a drive device according to one embodiment of the present disclosure.

Referring to FIG. 2, it shows an exploded view of the drive device 200 according to one embodiment of the present disclosure. The drive device 200 includes a top cover plate 220 and a bottom cover plate 240. The top cover plate 220 and the bottom cover plate 240 include substrates with the corresponding shapes respectively. The substrate 222 of the top cover plate 220 extends downwardly to form a top side wall 224, and the substrate 242 of the bottom cover plate 240 extends upwardly to form a bottom side wall 244. A cavity formed by the substrate 222 of the top cover plate 220, the top side wall 224, the substrate 242 of the bottom cover plate 240 and the bottom side wall 244 in an enclosure manner holds a fluid drive device 260. The fluid drive device 260 may be an air bag. The fluid drive device 260 is closely and fixedly connected with the substrate of the top cover plate 220 and the substrate of the bottom cover plate 240. When one of the top cover plate 220 and the bottom cover plate 240 is fixed on a predetermined position of the columns, by means of expansion and contraction of the fluid drive device 260, the other one of the top cover plate 220 and the bottom cover plate 240 that is not fixed on the columns, and the component connected therewith can be driven to move along the columns.

Wherein the substrate may not necessarily be rectangular, but hexagonal, circular, etc. The top side wall 224 and the bottom side wall 244 are usually in corresponding shapes, and one of the both has an inner wall diameter that is equal to or slightly smaller than the outer wall diameter of the other one, so that the top side wall 224 can be sleeved on the bottom side wall 244, or, the bottom side wall 244 can be sleeved on the top side wall 224.

Specifically, when the drive device 200 is arranged below the lower chamber portion, the drive device can be known as a lower drive device. The lower drive device includes a lower top cover plate and a lower bottom cover plate, the lower top cover plate and the lower bottom cover plate include substrates with the corresponding shapes respectively. The substrate of the lower cover plate extends downwardly to form a top side wall, and the substrate of the lower bottom cover plate extends upwardly to form a bottom side wall. A cavity formed by the substrate of the lower top cover plate, the top side wall, the substrate of the lower bottom cover plate and the bottom side wall in an enclosure manner holds a fluid drive device. The fluid drive device can be fixedly connected with the substrate of the lower top cover plate and the substrate of the lower bottom cover plate.

Corresponding column holes are formed on an edge of the substrates of the lower top cover plate and the lower bottom cover plate. The substrate of the lower bottom cover plate is fixed with the columns. The lower top cover plate and the lower chamber portion supported by the lower top cover plate are driven to move up or down under the guidance of the columns by means of expansion and contraction of the fluid drive device. The lower top cover plate and the neighboring lower chamber portion can be mutually fixed or integrally molded into one component.

Similarly, when the drive device 200 is arranged above the upper chamber portion, the drive device can be known as an upper drive device. The upper drive device includes an upper top cover plate and an upper bottom cover plate, the upper top cover plate and the upper bottom cover plate include substrates with the corresponding shapes respectively. The substrate of the upper top cover plate extends downwardly to form a top side wall, and the substrate of the upper bottom cover plate extends upwardly to form a bottom side wall. A cavity formed by the substrate of the upper top cover plate, the top side wall, the substrate of the upper bottom cover plate and the bottom side wall in an enclosure manner holds a fluid drive device. The fluid drive device can be fixedly connected with the substrate of the upper top cover plate and the substrate of the upper bottom cover plate.

Corresponding column holes are formed on an edge of the substrates of the upper top cover plate and the upper bottom cover plate. The substrate of the upper bottom cover plate is fixed with the columns and the substrate of the upper bottom cover plate is connected with the upper chamber portion. The upper bottom cover plate and the upper chamber portion connected with the upper bottom cover plate are driven to move up or down along the columns by expansion and contraction of the fluid drive device. The upper bottom cover plate and the neighboring upper chamber portion can be mutually fixed or integrally molded into one component.

As one of the key points and difficulties in the present disclosure, the multi-chamber semiconductor processing apparatus of the present disclosure adopts a column guidance structure and is longitudinally provided with a plurality of micro chambers on the column guidance structure in a longitudinal direction. The edges of the upper chamber portion and the lower chamber portion of each micro chamber include corresponding column holes. In some embodiments, both the upper chamber portion and the lower chamber portion are relatively movable along the columns that run through the column holes. However, in some other embodiments, one of the upper chamber portion and the lower chamber portion is fixed on a predetermined position of the columns, and the other one of the upper chamber portion and the lower chamber portion is driven by the drive device to move under the guidance of the columns.

Figure 3:
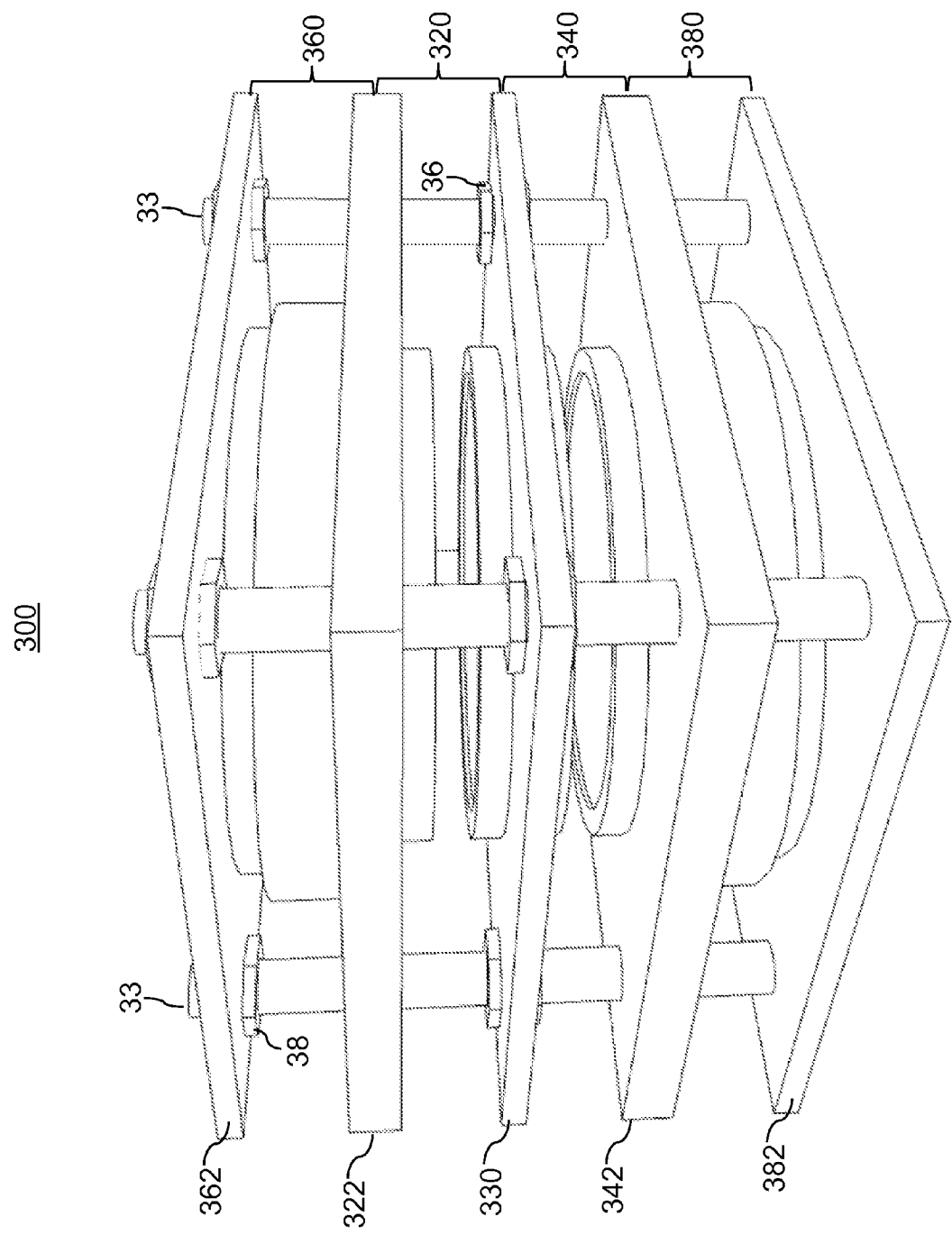
FIG. 3 is a perspective view of a multi-chamber semiconductor processing apparatus according to one embodiment of the present disclosure, as shown in an open position.
Figure 4:
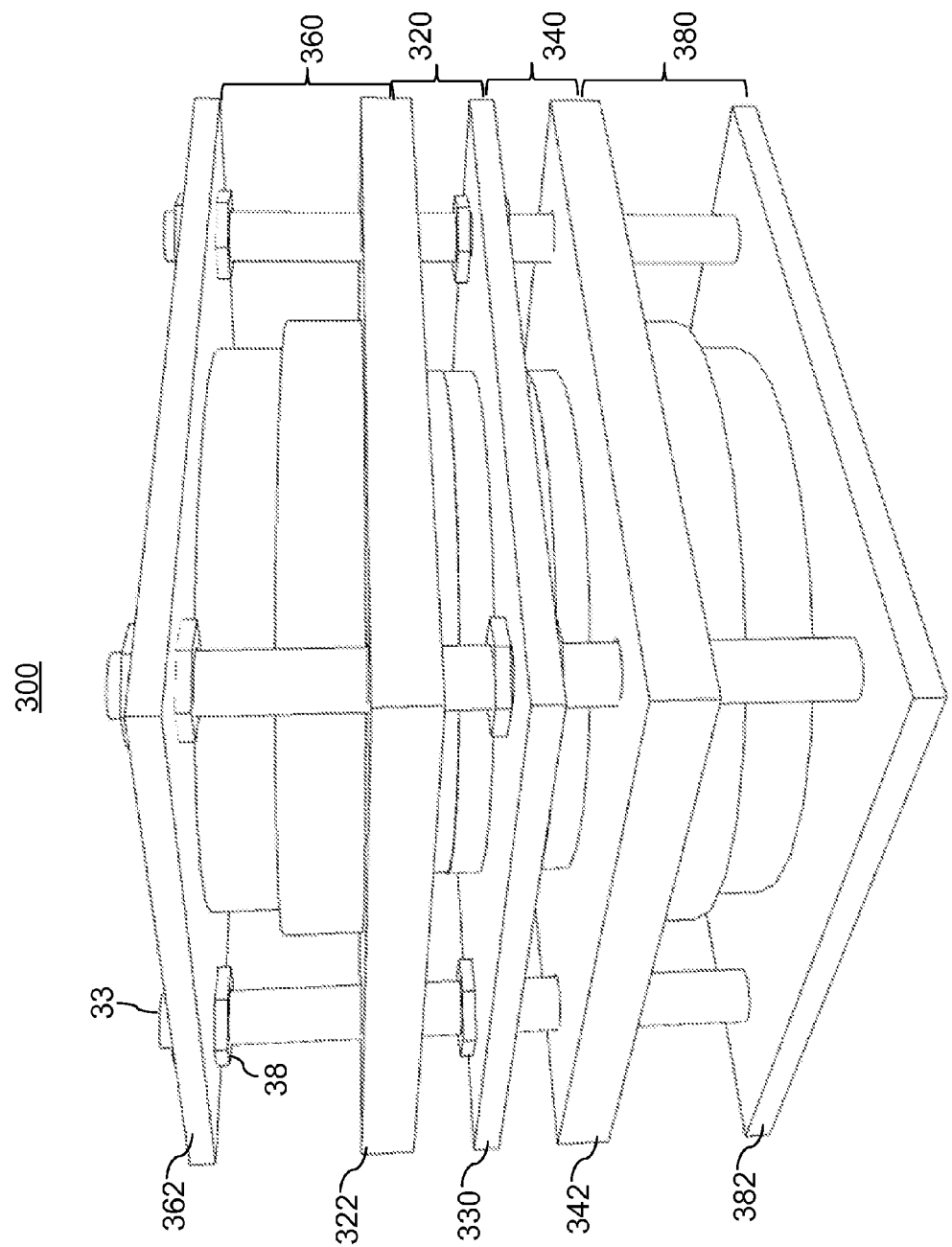
FIG. 4 is a perspective view of the multi-chamber semiconductor processing apparatus according to one embodiment of the present disclosure, as shown in a closed position.

Referring to FIG. 3 and FIG. 4, they show perspective views of the multi-chamber semiconductor processing apparatus according to one embodiment 300 of the present disclosure, as shown in the open position and closed position respectively. The multi-chamber semiconductor processing apparatus 300 includes a first micro chamber 320 and a second micro chamber 340, which are longitudinally arranged on the four columns 33. The partial outer surface of the columns 33 can be provided with screw threads (not shown).

Wherein, the first micro chamber 320 includes a first upper chamber portion 322, and a first middle plate 330 defining the lower chamber portion thereof. The second micro chamber 340 includes a first middle plate 330 defining the upper chamber portion thereof, and a second lower chamber portion 342. Specifically, the first middle plate 330 includes a rectangular substrate. The substrate extends upwardly to form the lower chamber portion of the first micro chamber 320 and extends downwardly to form the upper chamber portion of the second micro chamber 340, and the first middle plate 330 can be fixed on the columns 33 by nuts 36 matched with the screw threads on the columns 33, and accordingly are unmovable.

The multi-chamber semiconductor processing apparatus 300 further includes a first upper drive device 360 for driving the first upper chamber portion 322 to move up and down along the columns 33, and a first lower drive device 380 for driving the second lower chamber portion 342 to move up and down along the columns 33.

The first upper drive device 360 has a structure basically similar to the drive device shown in FIG. 2. The first upper drive device 360 includes an upper top cover plate 362 that can be fixed to the columns 33 by nuts 38. The upper bottom cover plate of the first upper drive device 360 and the first upper chamber portion 322 can be integrally molded into one component. Or, the first upper chamber portion 322 extends upwardly to form the upper bottom cover plate of the upper drive device 360. When the fluid drive device located in the first upper drive device 360 expands, the first upper chamber portion 322 is driven to move down along the columns 33, and stops at the closed position when being tightly adhered to the first middle plate 330. When the fluid drive device located in the first upper drive device 360 contracts, the first upper chamber portion 322 moves up along the columns 33, and stops at an open position after being separated from the first middle plate 330 by a particular distance.

The first lower drive device 380 also has a structure basically similar to the drive device shown in FIG. 2. The first lower drive device 380 includes a first lower bottom cover plate 382. The lower top cover plate of the first lower drive device 380 and the second lower chamber portion 342 are integrally molded into one component. Or, the surface of the second lower chamber portion 342 extends downwardly to form the lower top cover plate of the first lower drive device 380. When the fluid drive device located in the first lower drive device 380 expands, the second lower chamber portion 342 is driven to move up along the columns 33, and stops at the closed position when being tightly adhered to the first middle plate 330. When the fluid drive device located in the first lower drive device 380 contracts, the second lower chamber portion 342 moves down along the columns 33, and stops at an open position after being separated from the first middle plate 330 by a particular distance.

To sum up, the multi-chamber semiconductor processing apparatus 300 includes two micro chambers, wherein the lower chamber portion of the first micro chamber 320 is partially fixed on the columns and is accordingly unmovable, whereas the first upper chamber portion 322 is driven by the drive device to move along the columns; wherein, the upper chamber portion of the second micro chamber 340 is partially fixed on the columns and is accordingly unmovable, whereas the second lower chamber portion 342 is driven by the drive device to move along the columns; wherein, the lower chamber portion of the first micro chamber 320 and the upper chamber portion of the second micro chamber 340 are integrally molded into the first middle plate 330. The upper bottom cover plate of the first upper drive device 360 and the first upper chamber portion 322 are integrally molded into one component; the lower top cover plate of the first lower drive device 380 and the second lower chamber portion 342 are integrally molded into one component. Obviously, the first middle plate 330 may also be replaced by two mutually-fixed plates, i.e. the lower chamber portion of the first micro chamber 320 and the upper chamber portion of the second micro chamber 340 that are mutually fixed together. Other integrally-molded components may also be replaced by two components that are mutually fixed, and description is not repeated hereinafter.

Figure 5:
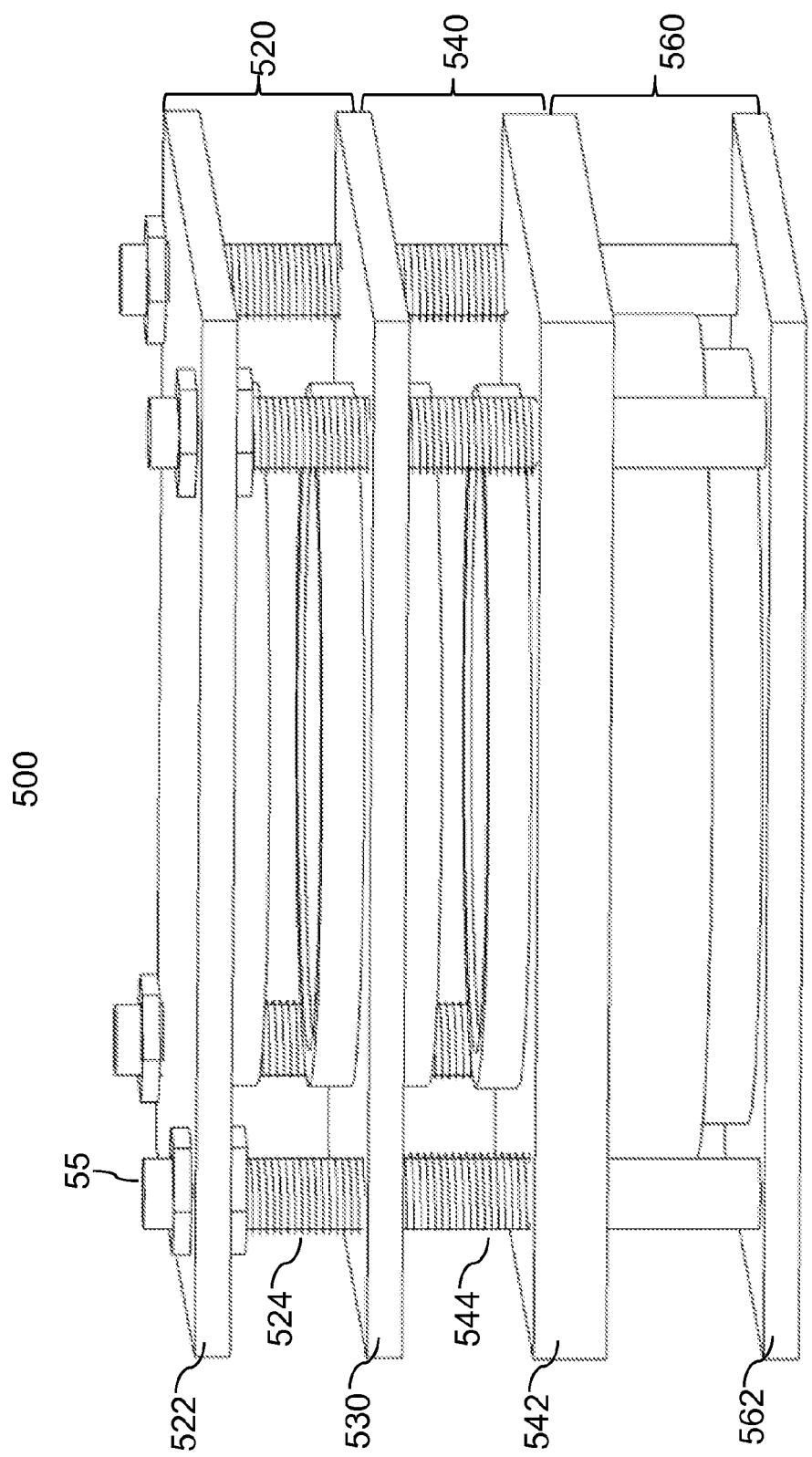
FIG. 5 is a perspective view of the multi-chamber semiconductor processing apparatus according to another embodiment of the present disclosure, as shown in the open position.
Figure 6:
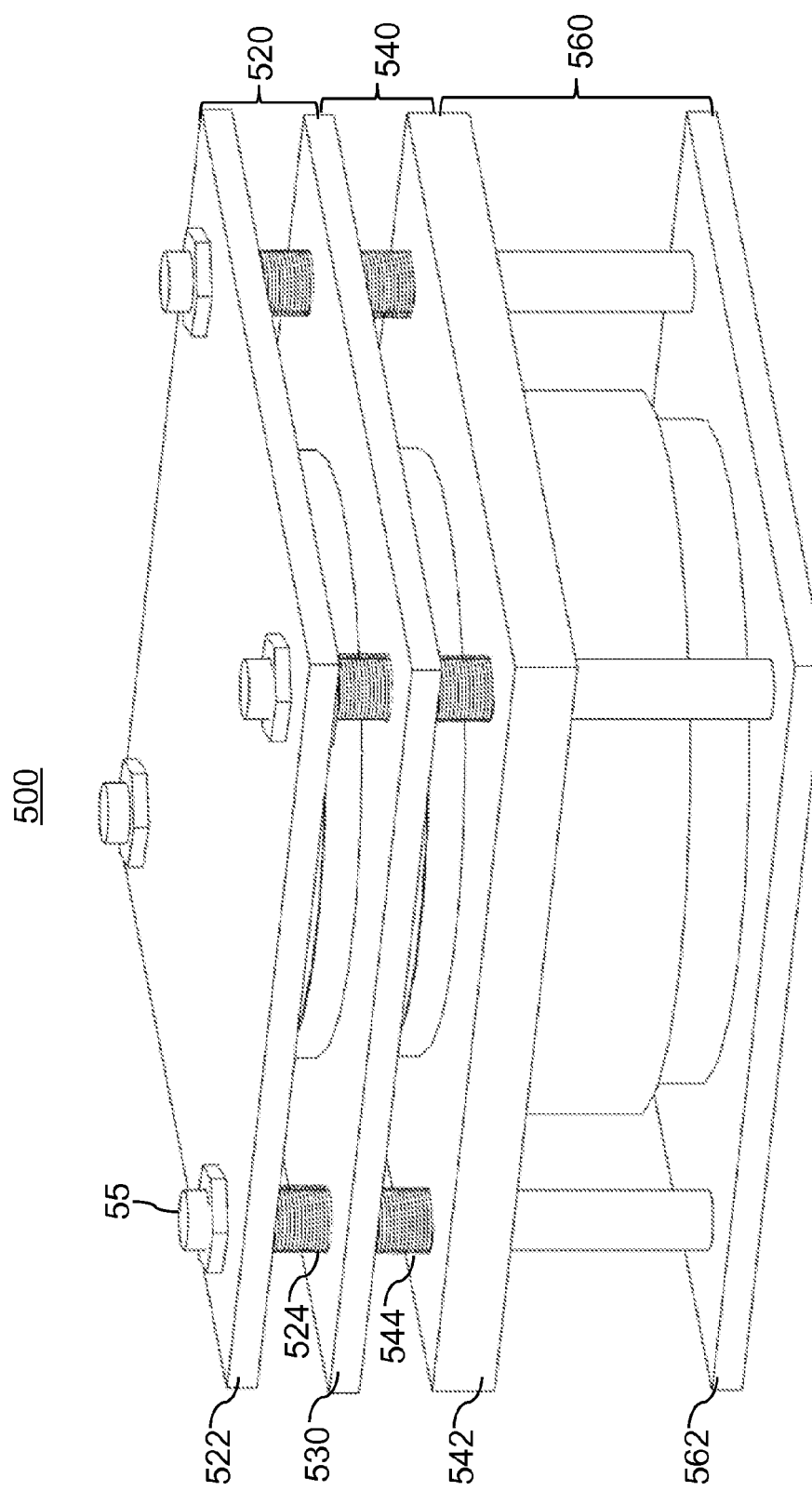
FIG. 6 is a perspective view of the multi-chamber semiconductor processing apparatus according to another embodiment of the present disclosure, as shown in the closed position.

In some other embodiments, a micro drive component for separating the upper chamber from the lower chamber by retractable movement is further disposed between the upper chamber portion and the lower chamber portion of every micro chamber in the multi-chamber semiconductor processing apparatus. The micro drive components may be springs, micro hydraulic devices, pneumatic devices and the like, which are sleeved on the columns. Driven by the driving forces from the micro drive component and the drive device, the upper chamber portion and the lower chamber portion of every micro chamber move up or down along the columns. Referring to FIG. 5 and FIG. 6, they show perspective views of the multi-chamber semiconductor processing apparatus 500 of the present disclosure position in another embodiment, as separately shown in the open position and closed position. The multi-chamber semiconductor processing apparatus 500 includes a third micro chamber 520 and a fourth micro chamber 540, which are longitudinally arranged on four columns 55. The third micro chamber 520 includes a third upper chamber portion 522, and a second middle plate 530 defining the lower chamber portion thereof. The fourth micro chamber 540 includes a second middle plate 530 defining the upper chamber portion thereof, and a fourth lower chamber portion 542. Specifically, the second middle plate 530 includes a rectangular substrate, which extends upwardly to form the lower chamber portion of the third micro chamber 520 and extends downwardly to form the upper chamber portion of the fourth micro chamber 540. The multi-chamber semiconductor processing apparatus 500 further includes a second lower drive device 560 for driving the second middle plate 530 and the fourth lower chamber portion 542 to move up and down along the columns 55.

The third upper chamber portion 522 can be fixed on the columns 55 by components such as nuts. First springs 524 sleeved to the columns 55 are further disposed between the third upper chamber portion 522 of the third micro chamber 520 and the second middle plate 530. When there are a plurality of columns 55, for example, four in this embodiment, the first spring 524 sleeved to each column 55 may be a helical extension spring with the same spring coefficient, size and shape.

Second springs 544 sleeved to the columns 55 are further disposed between the second middle plate 530 and the fourth lower chamber portion 542. The second spring 544 sleeved to each column 55 may also be a helical extension spring with the same spring coefficient, size and shape. Both the second middle plate 530 and the fourth lower chamber portion 542 can slide up and down along the columns 55.

The second lower drive device 560 includes a second lower bottom cover plate 562, and the lower top cover plate of the second lower drive device 560 and the fourth lower chamber portion 542 are integrally molded into one component. Or, the lower surface of the fourth lower chamber portion 542 extends downwardly to form the lower top cover plate of the second lower drive device 560. When the fluid drive device located in the second lower drive device 560 expands, the fourth lower chamber portion 542 move up along the columns 55, and simultaneously, the second middle plate 530 is driven by the bounce of the second springs 544 to move up as well, and finally stops at the closed position when the third upper chamber portion 522, the second middle plate 530 and the fourth lower chamber portion 542 are all tightly adhered. When the fluid drive device located in the second lower drive device 560 contracts, the fourth lower chamber portion 542 moves down along the columns 55, and by combination of the bounces of the first springs 524 and the second springs 544, the micro chamber finally stops at an open position when the third upper chamber portion 522, the second middle plate 530 and the fourth lower chamber portion 542 are all separated. However, it could be anticipated that, due to the gravity of the second middle plate 530, the fourth micro chamber 540 will be closed more tightly than the third micro chamber 520 if the first springs 524 and the second springs 544 are ones with the same spring coefficient. Therefore, the first springs 524 with lower spring coefficient and the second springs 544 with higher spring coefficient can be adopted to achieve the same tightness in the closing of the third micro chamber 520 and the fourth micro chamber 540.

To sum up, the multi-chamber semiconductor processing apparatus 500 includes two micro chambers, wherein the upper chamber portion of the third micro chamber 520 is fixed on the columns and is accordingly unmovable, whereas the second middle plate 530 that forms the lower chamber portion of the third micro chamber 520 and also the upper chamber portion of the fourth micro chamber 540, as well as the lower chamber portion 542 of the fourth micro chamber 540 are movable along the columns. It is clear from comparison with the semiconductor processing apparatus in the embodiment 300 that, the advantage of the semiconductor processing apparatus 500 is that a drive device can be saved, but the disadvantage of the semiconductor processing apparatus 500 is that the micro chambers are opened and closed at the same time, a single micro chamber cannot be opened and closed independently. Meanwhile, the semiconductor processing apparatus 500 further employs micro drive components, such as springs, to transmit driving forces, and may adopt springs with different spring coefficients to eliminate the effect of the gravity on the closing tightness of the micro chambers.

In some embodiments, the upper chamber portions of all the micro chambers in the multi-chamber semiconductor processing apparatus are fixedly connected together and the lower chamber portions of all the micro chambers are fixedly connected together. When the drive device drives the lower chamber portion of the bottommost micro chamber to move up, the lower chamber portions of all the micro chambers move up under the guidance of the columns; and when the drive device drives the upper chamber portion of the topmost micro chamber to move down, the upper chamber portions of all the micro chambers move down under the guidance of the columns.

Figure 7A:
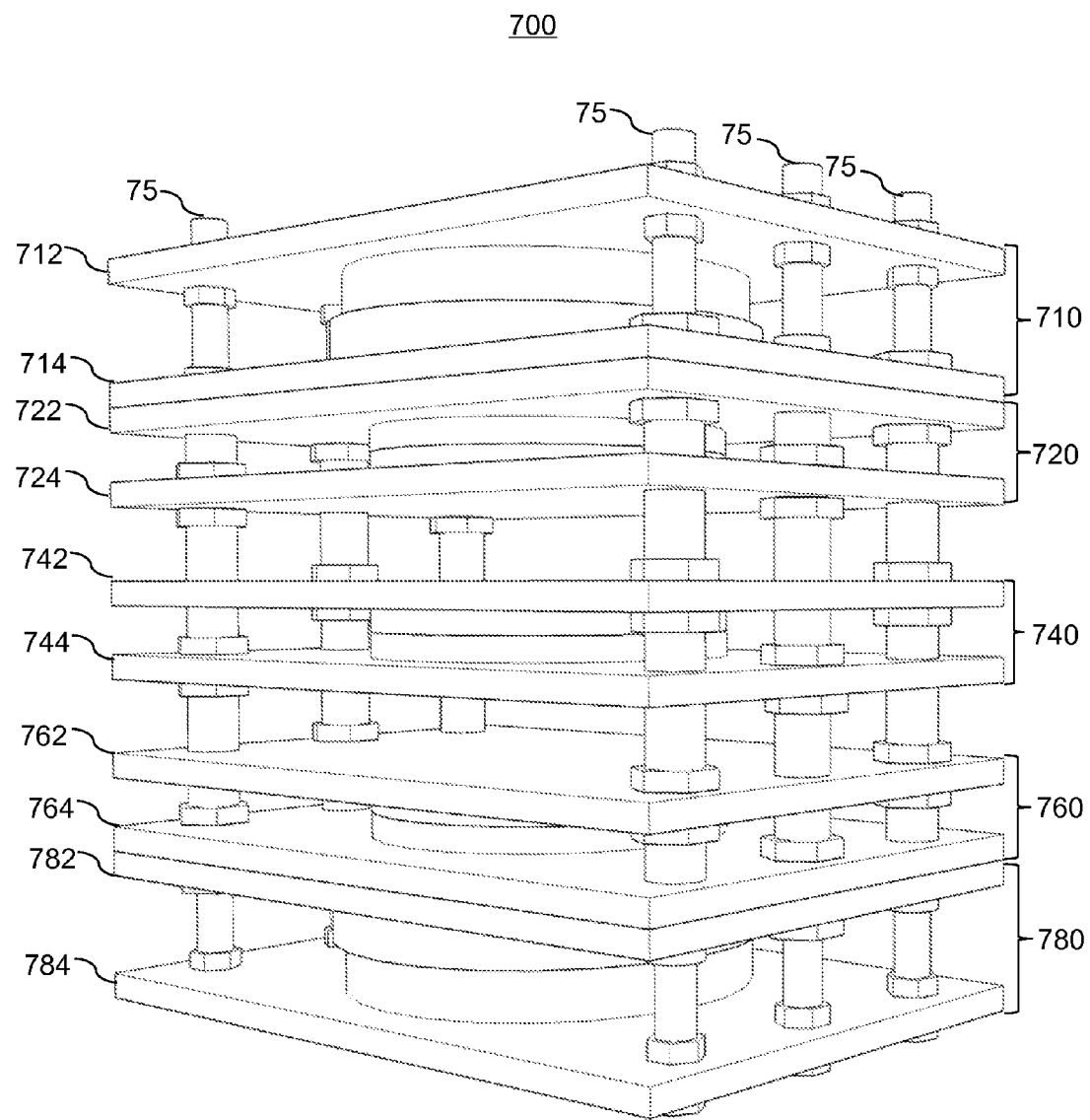
FIG. 7A is a perspective view of the multi-chamber semiconductor processing apparatus according to still another embodiment of the present disclosure, as shown in the closed position.
Figure 7C:
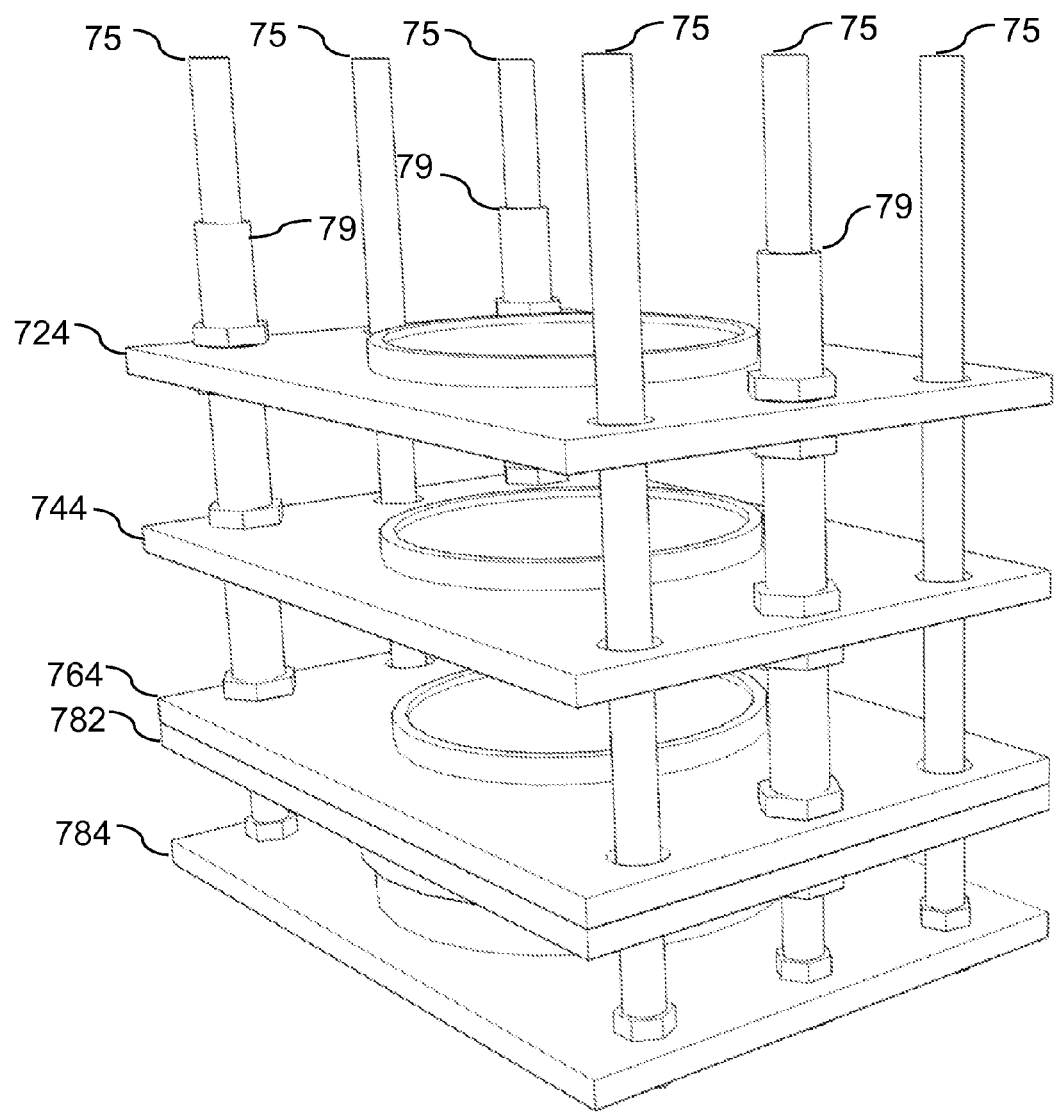
FIG. 7C is an assembly view of the lower chamber kit, the third lower drive device and the columns according to still another embodiment of the present disclosure.

Further referring to FIG. 7A, FIG. 7B and FIG. 7C, they show perspective views of the multi-chamber semiconductor processing apparatus according to still another embodiment 700 of the present disclosure. The multi-chamber semiconductor processing apparatus 700 includes three micro chambers longitudinally arranged on six columns 75, i.e. a fifth micro chamber 720, a sixth micro chamber 740 and a seventh micro chamber 760, respectively. Particularly, the three micro chambers are not directly fixed on the six columns 75, but fixed on six sleeves capable of sliding up and down along the six columns 75. The internal diameter of the six sleeves is equal to or slightly larger than the external diameter of the six columns 75. The six sleeves include three first sleeves 77 fixed to each upper chamber portion and three second sleeves 79 fixed to each lower chamber portion. The partial outer surfaces of the six columns 75, the first sleeves 77 and the second sleeves 79 can be provided with screw threads.

Specifically, the fifth micro chamber 720 includes a fifth upper chamber portion 722 and a fifth lower chamber portion 724; the sixth micro chamber 740 includes a sixth upper chamber portion 742 and a sixth lower chamber portion 744; the seventh micro chamber 760 includes a seventh upper chamber portion 762 and a seventh lower chamber portion 764. Six sleeve holes corresponding to the six columns and the respective sleeves are formed on the edge of each of the chamber portions. The internal diameter of the sleeve holes is equal to or slightly larger than the external diameter of the six sleeves. Wherein, the fifth upper chamber portion 722, the sixth upper chamber portion 742 and the seventh upper chamber portion 762 are all fixed on the first sleeves 77 through nuts. And the fifth lower chamber portion 724, the sixth lower chamber portion 744 and the seventh lower chamber portion 764 are all fixed on the second sleeves 79 through nuts. The three first sleeves 77 and the three second sleeves 79 are arranged crosswise, and according to the principle that three points determine a plane, the chamber portions are fixed on the sleeves and parallel to each other. And the neighboring upper chamber portions have the same predetermined interval, and the neighboring lower chamber portions have the same predetermined interval as well.

The multi-chamber semiconductor processing apparatus 700 further includes a second upper drive device 710 and a third lower drive device 780. Both the second upper drive device 710 and the third lower drive device 780 have a structure similar to the drive device shown in FIG. 2. The second upper drive device 710 includes an upper top cover plate 712, an upper bottom cover plate 714 and a fluid drive device (not shown) arranged between the upper top cover plate 712 and the upper bottom cover plate 714. The fluid drive device is fixedly connected with the upper top cover plate 712 and the upper bottom cover plate 714. The upper top cover plate 712 is directly fixed on the top of the columns 75 through nuts, and the upper bottom cover plate 714, together with the fifth upper chamber portion 722, is fixed on the first sleeves 77 through nuts. In other words, the upper bottom cover plate 714, the fifth upper chamber portion 722, the sixth upper chamber portion 742, the seventh upper chamber portion 762 and the first sleeves 77 are mutually fixed through nuts to form an upper chamber kit shown in FIG. 7B.

The third lower drive device 780 includes a lower top cover plate 782, a lower bottom cover plate 784, and a fluid drive device (not shown) arranged between the lower top cover plate 782 and the lower bottom cover plate 784. The fluid drive device is fixedly connected with the lower top cover plate 782 and the lower bottom cover plate 784. The lower bottom cover plate 784 is directly fixed on the bottom of the columns 75 through nuts. The lower top cover plate 782, together with the seventh lower chamber portion 764, is fixed on the second sleeves 79 through nuts. In other words, the lower top cover plate 782, the fifth lower chamber portion 724, the sixth lower chamber portion 744, the seventh lower chamber portion 764 and the second sleeves 79 are mutually fixed through nuts to form a lower chamber kit shown in FIG. 7C. It could be readily realized that, when the fluid drive device of the second upper drive device 710 and/or the third lower drive device 780 expands, the upper chamber kit and the lower chamber kit are relatively movable, and finally stop at the closed position when each pair of the upper chamber portions and each pair of the lower chamber portions are tightly adhered to each other; when the fluid drive device of the second upper drive device 710 and/or the third lower drive device 780 contracts, the upper chamber kit and the lower chamber kit move oppositely, and stop at an open position when each pair of the upper chamber portions is separated from each pair of the lower chamber portions. It should be appreciated that the distance between the upper chamber portions should be the same as that between the corresponding lower chamber portions, so that when the lower chamber portions of the fifth micro chamber 720, the sixth micro chamber 740 and the seventh micro chamber 760 accomplish the same displacement, they can be simultaneously under the adhesion or separation state same as the corresponding upper chamber portions. During implementation, the distance between the upper chamber portions and the distance between the lower chamber portions can be slightly adjusted through the nuts on the sleeves, and even the distance between the chamber portions can be slightly adjusted through the nuts on the sleeves.

Figure 8:
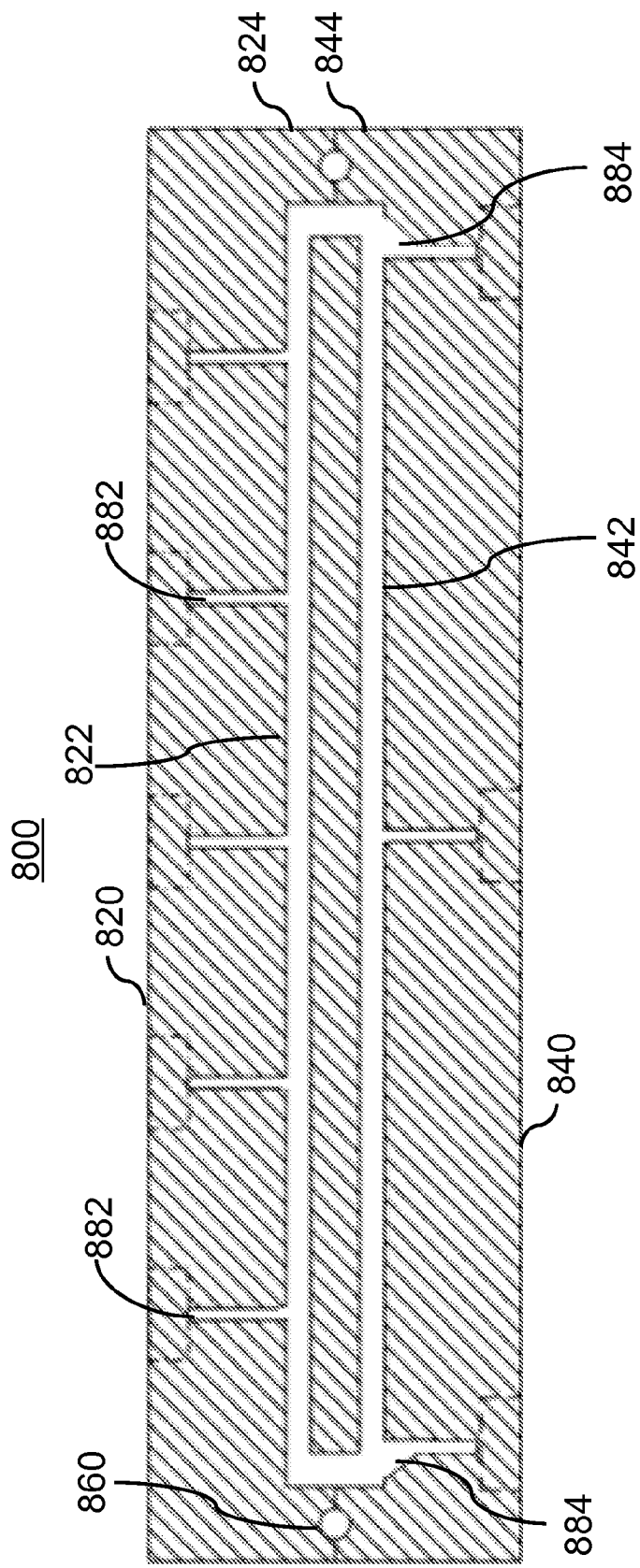
FIG. 8 is a cross-sectional view of the micro chamber according to one embodiment of the present disclosure.

For further illustrating the various aspects of the present disclosure, reference is continuously made to FIG. 8, which shows a cross-sectional view of the micro chamber 800 of the present disclosure in the embodiment. The micro chamber 800 includes an upper chamber plate 820 defining an upper working surface 822 and a first flange 824 around the upper working surface 822, and a lower chamber plate 840 defining a lower working surface 842 and a second flange 844 around the lower working surface 842. In general, the first flange 824 is opposite to the second flange 844 in position, and to achieve tight adherence, a coupling structure or a rubber-made seal ring 860 may also be arranged between the first flange 824 and the second flange 844. Certainly, the first flange 824 and the second flange 844 may be mutually engaged instead of being opposite to each other, or the first flange 824 and the second flange 844 are designed to be other consistent shapes on the basis of the specific embodiments, for example, opposite flanges and grooves.

The processed semiconductor wafer is contained in the micro chamber 800 formed by the upper working surface 822, the lower working surface 842, and the first flange 824 and/or the second flange 844 defining the perimeter portions. The gaps expected should be formed between the semiconductor wafer and the upper working surface and between the semiconductor wafer and the lower working surface, and the gap typically has a predetermined width of 0.01-10 mm. It shall be understood that the width of the gaps could be changed by different pressures of the upper chamber plate and the lower chamber plate and by seal rings with different internal diameters, and as these gaps change, different flow patterns of the processing fluids within the micro chamber 800 can be achieved, for example, the flow pattern from layered fluid flow to disturbed fluid flow is achieved. Certainly, for introducing the processing fluids, the micro chamber 800 should further include at least one inlet 882 for the processing fluids to enter into the micro chamber, at least one outlet 884 for discharging the processing fluids out of the micro chamber, and corresponding processing fluid supply and collection devices (not shown specifically). The processing fluid supply device can be connected with the inlet 882 for the processing fluids to enter into the micro chamber, and is used for supplying the processing fluids; and the processing fluid collection device can be connected with the outlet 884 for discharging the processing fluids out of the micro chamber, and is used for collecting the waste liquids after processing of the semiconductor wafer by the processing fluids. To acquire the expected flow patterns, the inlet 882 and the outlet 884 can be arranged at any or a plurality of preferred positions on the inner wall of the micro chamber 800. Further, to acquire the expected flow patterns better, the micro chamber may further include at least one inlet for gases to enter into the micro chamber and at least one outlet for discharging the gases out of the micro chamber (not shown). The gases entering the micro chamber through the inlet can act as a carrier during the flow of the processing fluids. A gas supply device, which is connected with the inlet for the gases to enter into the micro chamber, is used for supplying the gases that act as a carrier during the flow of the processing fluids; a gas collection device, which is connected with the outlet for discharging the gases out of the micro chamber, is used for collecting the waste gases after carrying for the flow of the processing fluids. The gas supply device also includes a device for vacuum formation, such as vacuum pump. Those gases can be considered as fluids, so for ease of description, the meaning of the processing fluids herein encompasses both chemical agents and gases.

On the other hand, in order to monitor and analyze the whole processing procedure, the semiconductor processing apparatus may further include a plurality of sensors for sensing the parameters of the processing fluids in the semiconductor processing apparatus before, during and after processing, such as temperatures, concentrations, materials contained and concentrations of the materials contained. The parameters such as those all depend upon different designers and processing requirements in the specific embodiments, and detailed description thereto is not given herein. However, it shall be noted that, corresponding adaptive changes and designs may be applied to those specific shapes and structures of the various components described above for the purpose of mounting and implementation of the various sensors, processing fluid supply and collection devices, gas supply and collection devices, etc.

As an example in specific use, the semiconductor processing apparatus of the present disclosure can be used for wet chemical etching of thin film copper. The processing liquids can be introduced into the micro chamber through the inlet located in the centre, then flow towards the edge of the semiconductor wafer in the radial direction, and can be collected in a predetermined device through the outlet at the lower perimeter portion after reaching the edge. During collection, the sensors can be used for monitoring the copper concentrations of the used processing liquids to acquire a real etching rate. The whole etching procedure is monitored in conjunction with acquisition of other parameters. Other processing procedures, such as surface cleaning for the semiconductor wafer, shall all be familiar to those skilled in this art, and detailed description thereto is not given herein.

The illustration above has fully exposed the specific embodiments of the present disclosure. It shall be noted that, any modifications made to the embodiments of the present disclosure by those skilled who are familiar with this art do not depart from the scope of the claims in the present disclosure. Accordingly, the scope of the claims in the present disclosure shall not be confined to the specific embodiments.

What is claimed is:

1. A multi-chamber semiconductor processing apparatus, comprising:
   a stack of at least two micro chambers each for receiving and processing a semiconductor wafer, each micro chamber including an upper chamber portion defining an upper working surface and a lower chamber portion defining a lower working surface, the upper chamber portion and the lower chamber portion being movable between an open position of the respective micro chamber for loading or removing the semiconductor wafer and a closed position of the respective micro chamber for receiving and processing the semiconductor wafer;

an upper drive device;

a lower drive device;

a plurality of columns comprising a plurality of first columns and a plurality of second columns, each of the first and second columns running through the upper chamber portion and the lower chamber portion of each of the micro chambers of the stack; and a plurality of sleeves comprising a plurality of first sleeves and a plurality of second sleeves, each of the first and second sleeves running through the upper chamber portion and the lower chamber portion of each of the micro chambers of the stack, wherein:

the upper chamber portion of each of the micro chambers except a topmost micro chamber of the stack opposes a lower chamber portion of another micro chamber of the stack, the lower chamber portion of each of the micro chambers except a bottommost micro chamber of the stack opposes an upper chamber portion of another micro chamber of the stack, the upper drive device is disposed on the upper chamber portion of the topmost micro chamber, the lower drive device is disposed on the lower chamber portion of the bottommost micro chamber, the upper chamber portions of the stack are fixedly connected via the plurality of first sleeves each sleeved to and movable along a respective column of the plurality of first columns, the lower chamber portions of the stack are fixedly connected via the plurality of second sleeves each sleeved to and movable along a respective column of the plurality of second columns, the upper drive device and the lower drive device are configured to move the upper chamber portions of the stack and the lower chamber portions of the stack, respectively, along the plurality of columns such that the upper and lower chamber portions of each of the at least two micro chambers of the stack are moved between the open position and the close position of the respective micro chamber, and when the respective micro chamber is in the closed position, the semiconductor wafer is disposed between the upper working surface and the lower working surface of the respective micro chamber to define, between the semiconductor wafer and an inner wall of the respective micro chamber, one or more gaps for one or more processing fluids to flow and process the semiconductor wafer.

2. The multi-chamber semiconductor processing apparatus of claim 1, wherein:

the upper drive device is configured to drive the upper chamber portion of the topmost micro chamber of the stack to move the upper chamber portions of the stack along the plurality of columns via the first sleeves, and the lower drive device is configured to drive the lower chamber portion of the bottommost micro chamber of the stack to move the lower chamber portions of the stack along the plurality of columns via the second sleeves.

3. The multi-chamber semiconductor processing apparatus of claim 1, wherein in two neighboring micro chambers, the lower chamber portion of a micro chamber of the at least two micro chambers that is located above in a longitudinal direction and the upper chamber portion of a micro chamber of the at least two micro chambers that is located below in the longitudinal direction are mutually fixed or integrally molded.

4. The multi-chamber semiconductor processing apparatus of claim 1, wherein screw threads are defined on an outer surfaces of each of the first sleeves and the second sleeves, and wherein each of the first sleeves and the second sleeves runs through an edge of the upper chamber portions or the lower chamber portions of the stack and is selectively fixed to the upper chamber portions or the lower chamber portions of the stack via nuts corresponding to the screw threads.

5. The multi-chamber semiconductor processing apparatus of claim 1, wherein each of the upper drive device and the lower drive device includes a top cover plate and a bottom cover plate, each of the top cover plate and the bottom cover plate comprising a substrates having a corresponding shape, the substrate of the top cover plate extending downwardly to form a top side wall and the substrate of the bottom cover plate extending upwardly to form a bottom side wall, the substrate of the top cover plate, the top side wall, the substrate of the bottom cover plate and the bottom side wall collectively forming a cavity in an enclosure manner that holds a fluid drive device connected with the substrates of the top cover plate and the substrate of the bottom cover plate, and wherein either of the top and bottom cover plates of each of the upper and lower drive devices is fixed on a predetermined position of the columns, the other top or bottom cover plate of the respective upper or lower drive device fixedly connected to or integrally molded with the upper chamber portion of the topmost micro chamber or the lower chamber portion of the bottommost micro chamber for driving the upper chamber portion of the topmost micro chamber or the lower chamber portion of the bottommost micro chamber to move along the columns due to an expansion or a contraction of the fluid drive device.

6. The multi-chamber semiconductor processing apparatus of claim 1, further comprising:

a processing fluid supply device supplying the one or more processing fluids to one or more of the micro chambers of the stack; and a processing fluid collection device discharging the one or more processing fluids from one or more of the micro chambers of the stack, wherein:

each micro chamber of the stack includes at least an inlet for receiving the one or more processing fluids from the processing fluid supply device, each micro chamber of the stack includes at least an outlet for discharging the one or more processing fluids to the processing fluid collection device, and the one or more processing fluids include chemical agents or gases.

7. The multi-chamber semiconductor processing apparatus of claim 1, wherein the plurality of first sleeves and the plurality of second sleeves are arranged crosswise.

8. The multi-chamber semiconductor processing apparatus of claim 1, wherein: the plurality of first columns comprise three first columns, the plurality of second columns comprise three second columns, the plurality of first sleeves comprise three first sleeves, the plurality of second sleeves comprise three second sleeves, each of the upper chamber portions of the stack is fixedly connected to the three first sleeves at three respective first locations of the three first sleeves, the three respective first locations determining a primary plane of the respective upper chamber portion, each of the lower chamber portions of the stack is fixedly connected to the three second sleeves at three respective second locations of the three second sleeves, the three respective second locations determining a primary plane of the respective lower chamber portion, and the primary plane of each of the upper chamber portions of the stack and the primary plane of each of the lower chamber portions are substantially parallel to each other.

9. The multi-chamber semiconductor processing apparatus of claim 8, wherein the primary planes of the upper chamber portions of the stack are spaced at a predetermined interval, and wherein the primary planes of the lower chamber portions of the stack are spaced at the predetermined interval.

10. The multi-chamber semiconductor processing apparatus of claim 9, wherein:
- screw threads are defined on an outer surface of each of the first sleeves and the second sleeves,
- each of the upper and lower chamber portions of the stack is fixed connected to the plurality of first or second sleeves via nuts corresponding to the screw threads, and the predetermined interval is configured to be adjusted through the nuts.

* * * * *